(12) United States Patent
Lee et al.

(10) Patent No.: US 6,320,227 B1
(45) Date of Patent: Nov. 20, 2001

(54) SEMICONDUCTOR MEMORY DEVICE AND METHOD FOR FABRICATING THE SAME

(75) Inventors: Jong Wook Lee; Gyu Seog Cho, both of Kyoungki-do (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 0 days.

(21) Appl. No.: 09/471,076

(22) Filed: Dec. 22, 1999

(30) Foreign Application Priority Data

Dec. 26, 1998 (KR) .................................................. 98-58927

(51) Int. Cl.[7] ........................... H01L 27/01; H01L 27/12; H01L 31/0392
(52) U.S. Cl. ............................................. 257/347; 257/296
(58) Field of Search ..................................... 257/311, 314, 257/347, 296, 369, 401, 906

(56) References Cited

U.S. PATENT DOCUMENTS

| | | | |
|---|---|---|---|
| 4,635,085 | 1/1987 | Taguchi | 357/23.6 |
| 5,497,018 * | 3/1996 | Kajita | 257/316 |
| 5,592,009 | 1/1997 | Hidaka | 257/351 |
| 5,707,897 | 1/1998 | Lee et al. | 438/257 |
| 5,716,864 * | 2/1998 | Abe | 438/258 |
| 5,789,293 * | 8/1998 | Cho et al. | 438/257 |
| 5,885,871 | 3/1999 | Chan et al. | 438/265 |
| 5,930,648 * | 7/1999 | Yang | 438/443 |
| 5,945,715 * | 8/1999 | Kuriyama | 257/369 |
| 6,020,643 * | 2/2000 | Fukuzumi et al. | 257/774 |
| 6,121,670 * | 9/2000 | Hisamune | 257/623 |

FOREIGN PATENT DOCUMENTS

| | | | |
|---|---|---|---|
| 7029992 | 1/1995 | (JP) | H01L/21/8242 |
| 06104410 | 4/1994 | (JP) | H01L/27/12 |

\* cited by examiner

*Primary Examiner*—David Nelms
*Assistant Examiner*—David Nhu
(74) *Attorney, Agent, or Firm*—Finnegan, Henderson, Farabow, Garrett & Dunner, L.L.P.

(57) ABSTRACT

A semiconductor memory device using a silicon-on-insulator device, including a semiconductor memory device capable of reducing the topology between a cell region and a peripheral region and preventing floating body effect.

4 Claims, 6 Drawing Sheets

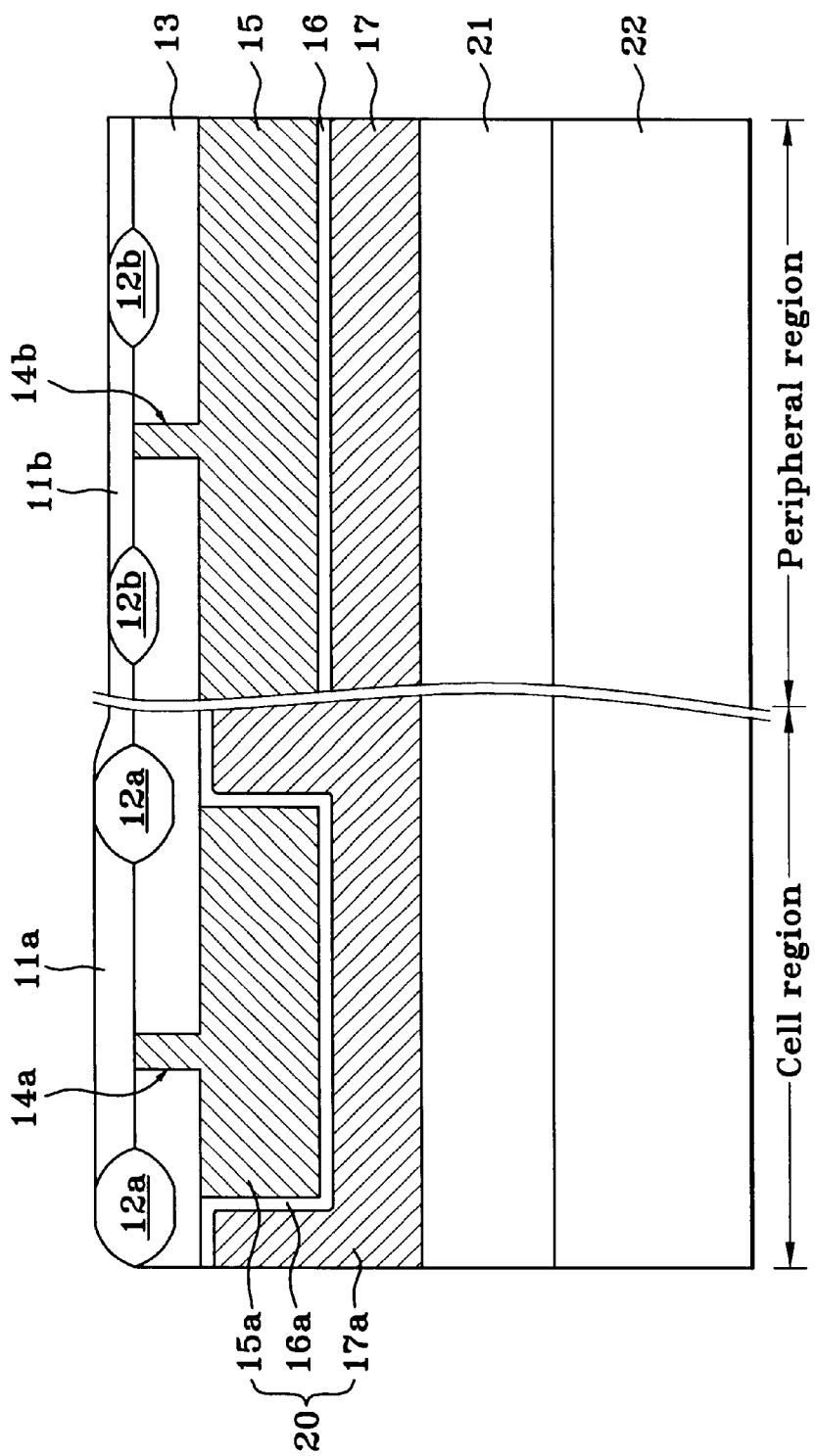

SEMICONDUCTOR MEMORY DEVICE AND METHOD FOR FABRICATING THE SAME

BACKGROUND OF THE INVENTION

1. Field of the Invention

This invention relates to a semiconductor memory device using a silicon-on-insulator(SOI) device, and more particularly to a semiconductor memory device capable of reducing the topology between a cell region and a peripheral region and preventing floating body effect.

2. Description of the Related Art

The high integration of semiconductor devices such as DRAMs goes with reduction of a cell size and in this case, it is indispensable to increase the height of a capacitor so as to assure a desired capacitance. The capacitance is inversely proportional to the distance between capacitor electrodes which are a storage node and a plate node and proportional to a dimension of the capacitor electrode and a dielectric constant of a dielectric film. Therefore, reduction of the cell dimension causes the dimension of the capacitor electrode and so as to compensate this, it should be increase the height of the capacitor electrode. However, because the capacitor is formed only in a cell region, if the height of the capacitor is increased, the topoloy between the cell region and a peripheral region is largely increased. Accordingly, it is very difficult to form contact holes in the peripheral region in the following formation of metal interconnections.

On demand for a semiconductor memory device with high performance and low power, various studies on the semiconductor memory device and circuit have been progresses. In a device aspect, the semiconductor integration technology using a single crystal substrate being comprised of bulk Si is at the limit. In stead of the bulk silicon substrate, the semiconductor integration technology using the silicon on insulator (SOI) wafer is remarked, which includes a base substrate for supporting means, a buried oxide for bonding medium and a semiconductor layer for providing a device formation region in stack. It is because the devices fabricated in the SOI wafer have advantages of high performance due to reduction of capacitance, low driving voltage due to reduction of a threshold voltage and reduction in latch-up due to complete isolation, as compared with conventional devices fabricated in the silicon substrate.

As shown in FIG. 1, a body of a transistor 10 including a channel region 3a is floated from a base substrate 1 and holes generated by impact ionization in the transistor operation do not go out of the channel region 3a but remain in the channel region 3a. Because the SOI devices cause the floating body effect such as Kink phenomenon that the peak of the drain current in the transistor 10 rapidly rises, they do not utilize in general despite the above advantage. Accordingly, the memory device fabricated in the SOI wafer has an undesired characteristic in the circuit aspect, it is applicable to fabricate the semiconductor memory device with high performance and low power.

In FIG. 1, the reference numeral 2 designates a buried oxide, 3 a semiconductor layer, 4 an isolation film, 5 a gate oxide, a gate and 7 source/drain region, respectively.

Therefore, so as to fabricate the memory device with high performance and low power using the SOI wafer, it should solve the problem due to topology between the cell region and the peripheral region and the problem due to the floating body effect.

SUMMARY OF THE INVENTION

It is an object of the present invention to provide a semiconductor memory device with high performance and low power and a method for fabricating the same.

According to an aspect of the present invention, there is provided to a semiconductor memory device, comprising: a semiconductor layer including a cell region and a peripheral region; a first insulating layer formed over a lower surface of the semiconductor layer and having first and second contact holes exposing the semiconductor layer in the cell region and the semiconductor layer in the peripheral region, respectively; first isolation layers formed in the semiconductor layer of the cell region; second isolation layers formed in the semiconductor layer of the peripheral region to define a device formation region in the peripheral region; a pair of trench layers formed to define a device formation region in the semiconductor layer of the cell region and formed in the semiconductor layer between the first isolation layers to be spaced from the lower surface of the semiconductor layer; a cell transistor formed in the device formation region between the trench layers in the cell region, the cell transistor including a first gate having a first gate oxide formed over an upper surface of the semiconductor layer in the device formation region, first source and drain regions formed in the device formation region of the cell region at the both sides of the first gate and a channel region defined in the device formation region between the first source and drain regions; a driving transistor formed in the device formation region of the peripheral region, the driving transistor including a second gate having a second gate oxide formed over an upper surface of the semiconductor layer in the device formation region of the peripheral region, second source and drain regions formed in the device formation region of the peripheral region at the both sides of the second gate, and a channel region defined in the device formation region between the second source and drain regions; impurity regions for well pick-up formed in the upper surface of the semiconductor layer adjacent to the cell transistor; a capacitor formed over the first insulating layer in the cell region, the capacitor including a storage node formed over the first insulating layer to be contacted with the first source region of the cell transistor through the first contact hole and a dielectric film and a plate node formed over the storage node; a dummy pattern formed over the first insulating layer in the peripheral region, the dummy pattern including a first doped polysilicon layer, a second insulating layer and a second doped polysilicon layer formed over the first insulating layer of the peripheral region, the first doped polysilicon being contacted with the channel region of the driving transistor through the second contact hole; a third contact hole formed in the semiconductor layer and the first insulating layer in the peripheral region; a conduction layer formed within the third contact hole to be contacted with the first doped polysilicon layer of the dummy pattern; a third insulating layer formed over the plate node of the capacitor in the cell region and over the second doped polysilicon layer of the dummy pattern in the peripheral region; and a base substrate bonded on the third insulating layer.

There is also provided to a method for fabricating a semiconductor memory device, comprising the steps of: preparing a silicon substrate including a cell region and a peripheral region; in one surface of silicon substrate, forming first isolation layers in the cell region and second isolation layers in the peripheral region; forming a first insulating layer having first and second contact holes over the one surface of the silicon substrate including the first and second isolation layers; forming a first doped polysilicon layer over the first insulating layer to be buried with the first and second contact holes; patterning the first doped polysilicon layer to form a storage node of a capacitor in the cell region, the doped polysilicon layer remaining in the peripheral region as it is; forming a second insulating layer and a second doped polysilicon layer in turn over the first insulating layer including the storage node in the cell region and over the first doped polysilicon layer in the peripheral region; patterning the second insulating layer and the second doped polysilicon layer to form a dielectric film and a plate node of the capacitor, the second insulating layer and the second doped polysilicon layer remaining in the peripheral region as it is; forming a third insulating layer over the first insulating layer including the capacitor in the cell region and over the second doped polysilicon layer in the peripheral region; boding a base substrate on the third insulating layer; polishing another surface of the silicon substrate to form semiconductor layers in the cell region and the peripheral region, respectively, until the first and second isolation layers are exposed; forming a pair of trench layers in the semiconductor layer in the cell region to be spaced from the first insulating layer; forming a cell transistor in the semiconductor layer of the cell region between the trench layers and a driving transistor in the semiconductor layer of the peripheral region, the cell transistor including a first gate having a first gate oxide formed over the semiconductor layer in the cell region, first source and drain regions formed in the semiconductor layer of the cell region and a channel region defined in the semiconductor layer between the first source and drain regions in the cell region, the first source region of the cell transistor being contacted with the storage node of the capacitor, the driving transistor including a second gate having a second gate oxide formed over the semiconductor layer of the peripheral region, second source and drain regions formed in the semiconductor layer of the peripheral region and a channel region defined in the semiconductor layer between the second source and drain regions in the peripheral region, the channel region of the driving transistor being contacted with the first doped polysilicon layer of the dummy pattern; forming impurity regions for well pick-up in the another surface of the semiconductor layer in the cell region adjacent to the cell transistor; and forming a conduction layer in the semiconductor layer and the first insulating layer in the peripheral region adjacent to the driving transistor to be connected with the first doped polysilicon layer.

BRIEF DESCRIPTION OF THE DRAWINGS

The objects and features of the invention may be understood with reference to the following detailed description of an illustrative embodiment of the invention, taken together with the accompanying drawings in which:

FIG. 2A to FIG. 2G are sectional views illustrating a method for fabricating a semiconductor memory device in accordance with an embodiment of the present invention.

DETAILED DESCRIPTION OF THE INVENTION

A semiconductor memory device is fabricated by using a SOI technology. In particular, the SOI wafer is fabricated following a capacitor formation and then a cell transistor in a cell region and a driving transistor in a peripheral region are formed, respectively. Hereinafter, an embodiment of the present invention will be described with reference to drawings in more detail.

Figure 1:
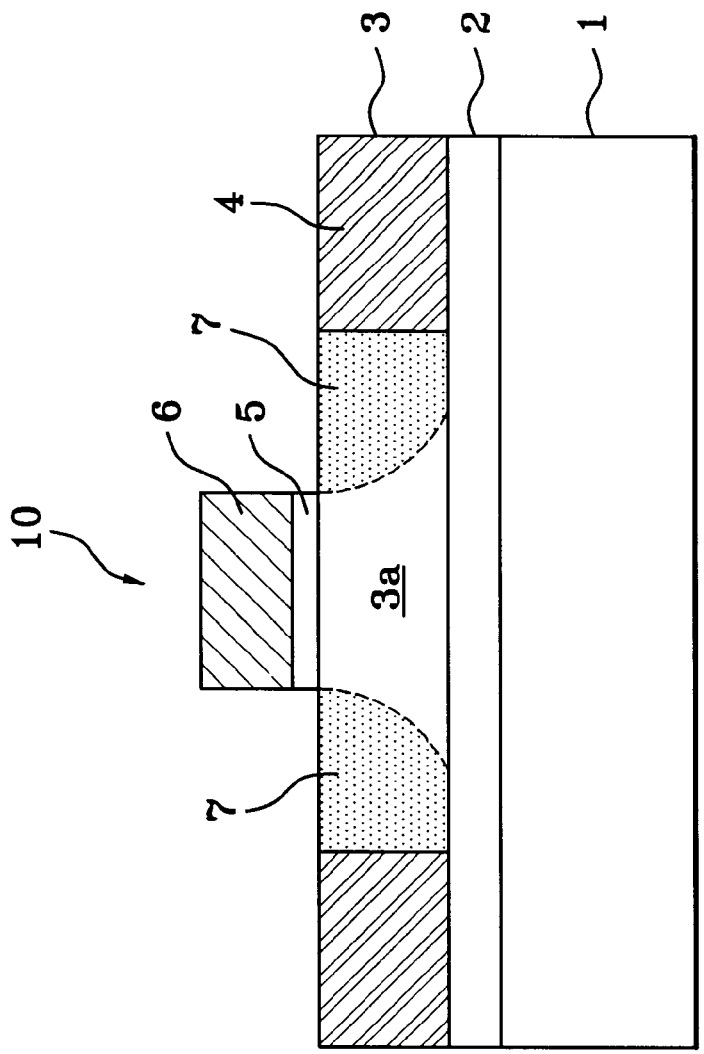
FIG. 1 is a sectional view of a transistor formed in a SOI wafer in the prior art.
Figure 2A:
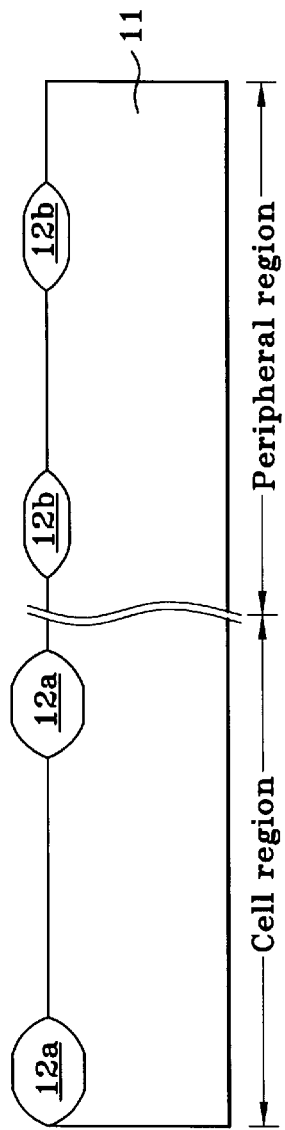

Referring to FIG. 2A, a silicon substrate 11 which is divided into a cell region and a peripheral region and is comprised of Si is prepared and first isolation layers 12a and second isolation layers 12b are formed in the cell region and the peripheral region of the semiconductor substrate by a LOCOS process, respectively. Herein, the first isolation layer 12a has a different thickness from the second isolation layer 12b and the first isolation layer 12a in the cell region is formed thicker than the second isolation layer 12b in the peripheral region. The first and second isolation layers 12a and 12b use as polishing stoppers in the following CMP process and the thickness of a semiconductor layer for providing a device formation region is limited by the thicknesses of the first and second isolation layers 12a and 12b. Accordingly, the first isolation layers 12a are thick as twice as a semiconductor layer desired in the cell region. The thickness of the semiconductor layer desired for stable driving of a cell transistor is 200 nm. The second isolation layers 12b are thick as twice as a semiconductor layer desired in the peripheral region. The thickness of the semiconductor layer desired for high performance of a driving transistor is 100 nm.

Figure 2B:
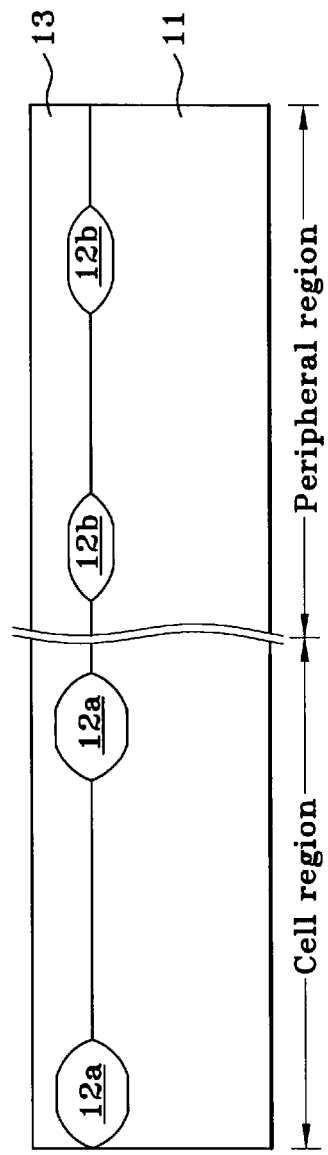
Figure 2C:
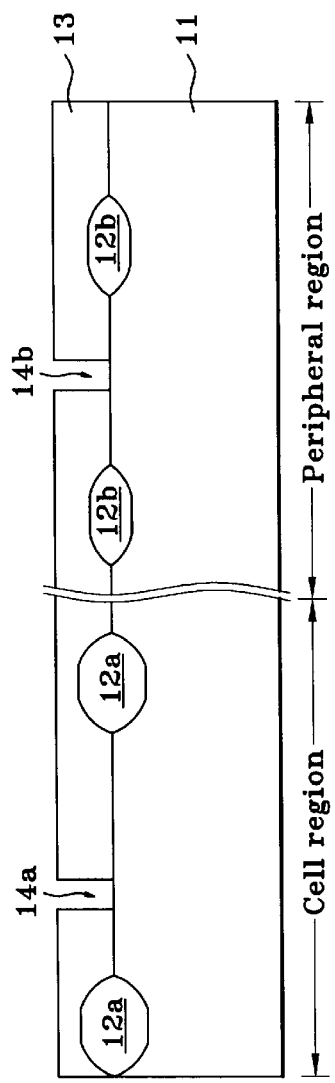

Referring to FIG. 2B, a first insulating layer 13 is formed over one surface of the semiconductor substrate 11 including the first and the second isolation layers 12a and 12b. Herein, the first isolation layer 13 is used for a buried oxide layer of a SOI wafer which is to be fabricated in the following process. Referring to FIG. 2C, the first isolation layer 13 is etched to form a first and a second contact holes 14a and 14b, thereby exposing the cell region and the peripheral region of the substrate 11, respectively. The first contact hole 14a exposing the cell region is for connecting a source region with a storage node of the cell transistor and the contact hole 14b exposing the peripheral region is for connecting a channel region of the driving transistor and a conduction layer connected to a ground terminal.

Figure 2D:
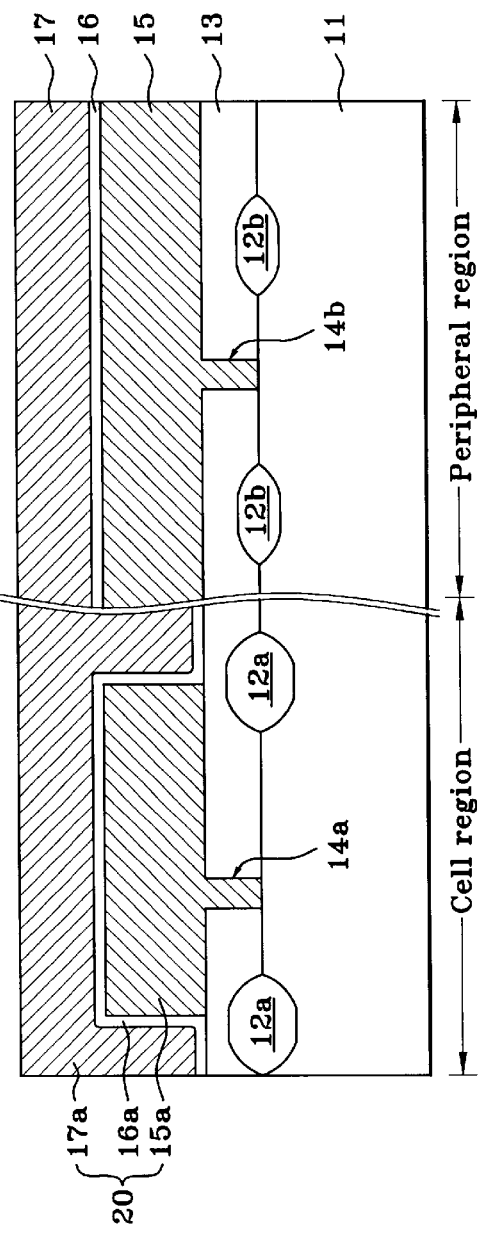

Referring to FIG. 2D, a first doped polysilicon layer 15 is formed over the first insulating layer 13 to be buried with the first and second contact holes 14a and 14b. A portion of the first doped polysilicon layer 15 in the cell region is patterned to form a storage node 15a and a portion of the first doped polysilicon layer 15 in the peripheral region remains as it is.

A second insulating layer 16 and a second doped polysilicon layer 17 are deposited in turn over the resultant surface of the semiconductor substrate 11 and then the second insulating layer 16 and the second doped polysilicon layer 17 in the cell region are etched to form a dielectric film 16a and a plate node 17a, thereby forming a capacitor 20 including the storage node 15a, the dielectric film 16a and the plate node 17a in the cell region. The second insulating layer 16 and the second doped polysilicon layer 17 remain as it is. Herein, the remaining first and second doped polysilicon layers and the second insulating layer is a dummy pattern for removing the topology between the cell region and the peripheral region.

Figure 2E:
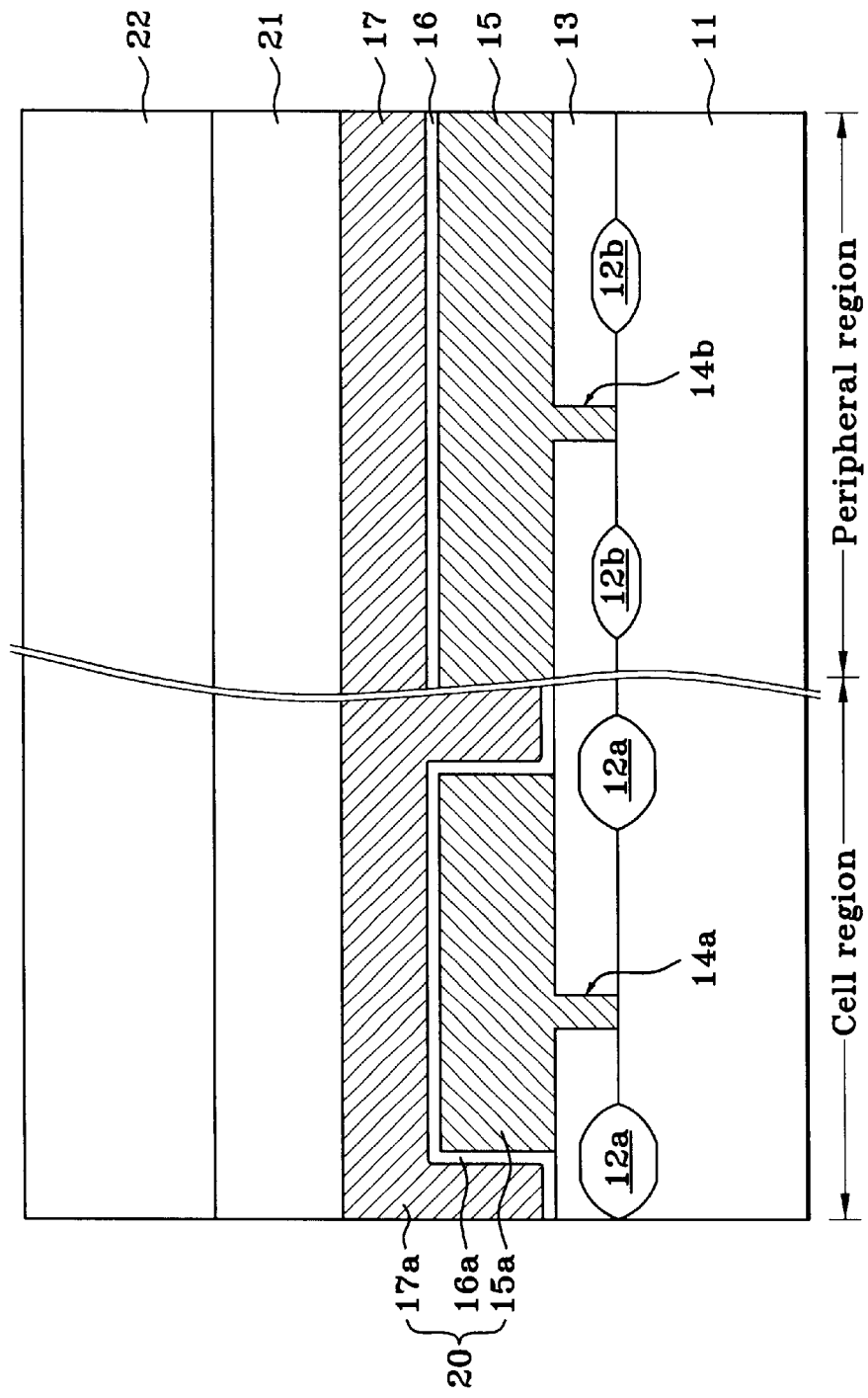

Referring to FIG. 2E, a third insulating layer 21 is formed over the first insulating layer 21 to cover the capacitor 20 in the cell region and over the second doped polysilicon layer 17 in the peripheral region. Then the third insulating layer 21 is polished by chemical mechanical polishing (CMP) method so as to be planarized. The third insulating layer 21 is comprised of BPSG, PSG or USG deposited by LPCVD, PECVD or APCVD.

A base substrate 22 is boned on the planarized third insulating layer. The base substrate 22 is comprised of a silicon substrate. In stead of a silicon substrate, any one of a quartz substrate, a glass substrate or a sapphire may be used for the base substrate.

Figure 2G:
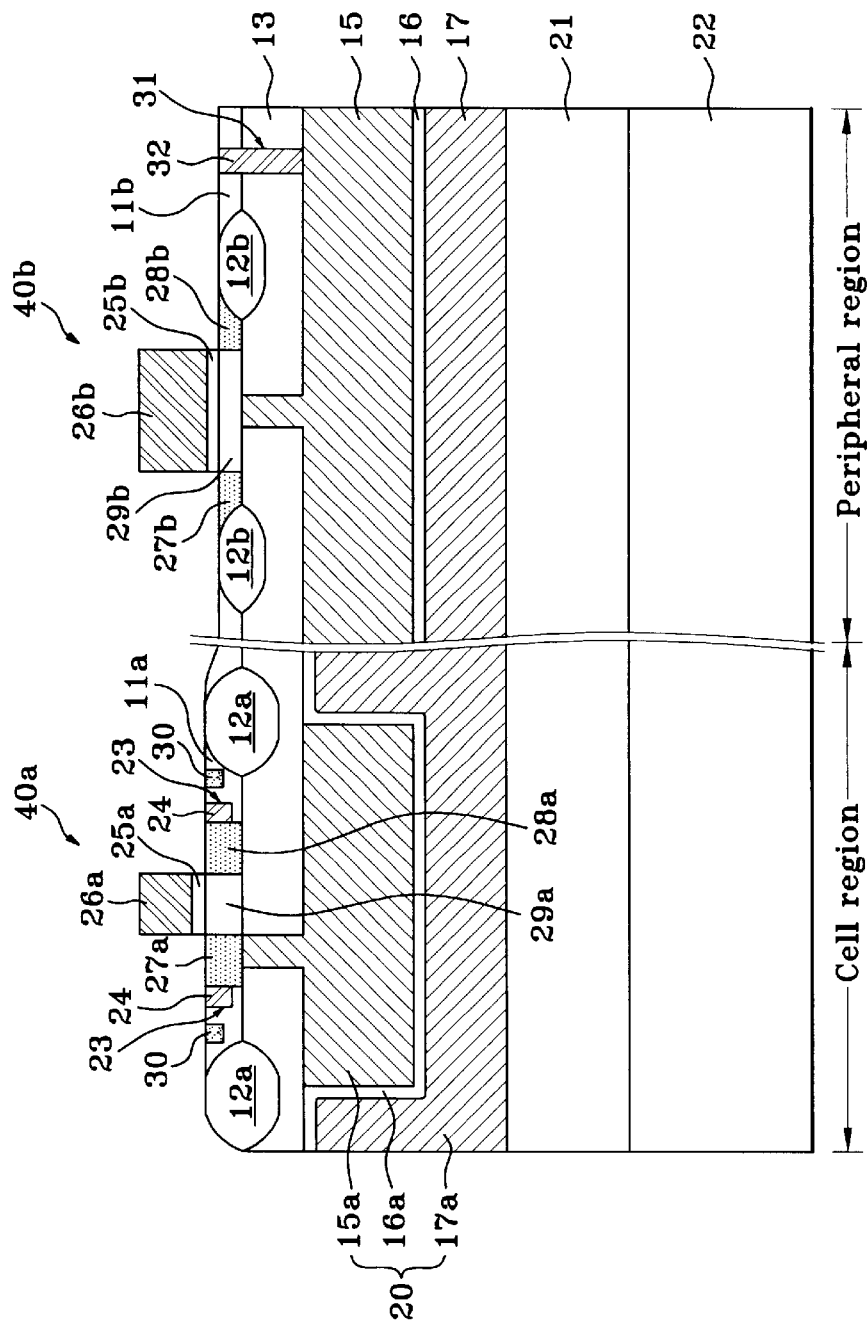

FIG. 2F and FIG. 2G are sectional views where the following processes are progressed with turning the base substrate and the semiconductor substrate over. Referring to FIG. 2F, another surface of the semiconductor substrate 11 is polished by CMP to form the first semiconductor layer 11a in the cell region and the second semiconductor layer 11b in the peripheral region, respectively, until the first and second isolation layers are exposed. At this time, the first semiconductor layer 11a in the cell region is formed at a different thickness from the second semiconductor layer 11b in the peripheral region due to the thickness difference between the first isolation layers 12a and the second isolation layers 12b. The thickness of the first semiconductor layer 11a is thicker than that of the second semiconductor layer 11b. To form the first and second semiconductor layers 11a and 11b is to form a SOI wafer. In particular, the capacitor is formed within the SOI wafer so that the topology between the cell region and the peripheral region due to the capacitor formation can be removed.

Referring to FIG. 2G, a pair of trenches 23 are formed in the first semiconductor layer 11a of the cell region not to be contacted with the first insulating layer 13 and a pair of trench layers 24 are formed by burying the oxide layer with the pair of trenches 23. The trench layers are formed to be spaced from the one surface of the semiconductor layer 11a and they serve as isolation layers in the cell region. A cell transistor 40a is formed in the first semiconductor layer 11a between the pair of the trench layers 24. The cell transistor 40a includes a first gate 26a having a first gate oxide 25a which is formed over the first semiconductor layer 11a and first source and drain regions 27a and 28a which is formed in the first semiconductor layer 11a at the both sides of the gate 26a. The first source and drain regions 27a and 28a are formed to be contacted with the first insulating layer 13 and the trench layers. A portion of the first semiconductor layer between the first source and drain regions 27a and 28a is a channel region 29a of the cell transistor 40a. In particular, the first source region 27a is formed to be contacted with the storage node 15a of the capacitor 20 through the first contact hole 14a. An impurity ions are implanted into the another surface of the first semiconductor layer 11a to form impurity regions 30 for well pick-up adjacent to the cell transistor 40a.

A driving transistor 40b is simultaneously formed in a device formation region of the second semiconductor layer 12b in the peripheral region in forming the cell transistor in the cell region. The driving transistor 40b includes a second gate 26b having a second gate oxide 25b which is formed over the second semiconductor layer lib and second source and drain regions 27b and 28b which is formed in the second semiconductor layer 11b at the both sides of the second gate. The second source and drain region 27b and 28b are formed to be contacted with the first insulting layer 13 and a channel region 29b of the driving transistor 40b between the second source and drain regions 27b and 28b in the second semiconductor layer 11b is contacted with the first doped polysilicon layer 15. A second semiconductor layer 11b and the first insulating layer 13 are etched to form a third contact hole 31 in the peripheral region except for the device formation region. A conduction layer being comprised of conduction material such as polysilicon or metal is formed in the third contact hole 31.

The semiconductor memory device of the present invention fabricated by the above mentioned method has advantages as follows. First, the trench layers 24 are formed in the first semiconductor layer 11a to be spaced from the first insulating layer 13 so that it can control the body potential by applying the predetermined voltage to the impurity regions 30 for well pick-up. Accordingly, it can prevent charges from accumulating in the channel region 29a of the cell transistor 40a, thereby obtaining the stable operation characteristic of the cell transistor 40a.

Secondly, the channel region 29b of the driving transistor 40b is electrically connected to the conduction layer 32 through the first doped polysilicon layer 15. If it connects the conduction layer 32 to the ground terminal, holes generated by impact ionization in the driving transistor operation are removed through the first doped polysilicon layer 15 and the conduction layer 32. Accordingly it can prevent the Kink phenomenon of the drain current, thereby obtaining the stable operation characteristic of the driving transistor 40b.

Thirdly, the capacitor is formed within the SOI wafer and it does not cause the topology between the cell region and the peripheral region, thereby carrying out the metal interconnection process in the peripheral region with ease. Furthermore, the semiconductor memory devices fabricated in the SOI wafer can accomplish the high performance due to reduction of the junction capacitance.

According to the present invention, it can prevent the floating body effect in the transistor fabricated in the SOI wafer and remove the topology between the cell region and the peripheral region. Accordingly, it can obtain the stable operation characteristics of the cell transistor and the driving transistor and carry out the metal interconnection process with ease, thereby being capable of fabricating the semiconductor memory device with high performance and low power.

While the invention has been particularly shown and described with respect to preferred embodiment thereof, it will be understood by those skilled in the art that various changes in form and details may be made therein without departing from the spirit and the scope of the invention as defined by the following claims.

What is claimed is:

1. A semiconductor memory device, comprising:

a semiconductor layer including a cell region and a peripheral region;

a first insulating layer formed over a lower surface of the semiconductor layer and having first and second contact holes exposing the semiconductor layer in the cell region and the semiconductor layer in the peripheral region, respectively;

first isolation layers formed in the semiconductor layer of the cell region;

second isolation layers formed in the semiconductor layer of the peripheral region to define a device formation region in the peripheral region;

a pair of trench layers formed to define a device formation region in the semiconductor layer of the cell region and formed in the semiconductor layer between the first isolation layers to be spaced from the lower surface of the semiconductor layer;

a cell transistor formed in the device formation region between the trench layers in the cell region, the cell transistor including a first gate having a first gate oxide formed over an upper surface of the semiconductor layer in the device formation region of the cell region, first source and drain regions formed in the device formation region of the cell region at the both sides of the first gate and a channel region defined in the device formation region between the first source and drain regions;

a driving transistor formed in the device formation region of the peripheral region, the driving transistor including a second gate having a second gate oxide formed over an upper surface of the semiconductor layer in the device formation region of the peripheral region, second source and drain regions formed in the device formation region of the peripheral region at the both sides of the second gate, and a channel region defined in the device formation region between the second source and drain regions;

impurity regions for well pick-up formed in the upper surface of the semiconductor layer adjacent to the cell transistor;

a capacitor formed over the first insulating layer in the cell region, the capacitor including a storage node formed over the first insulating layer to be contacted with the first source region of the cell transistor through the first contact hole and a dielectric film and a plate node formed over the storage node;

a dummy pattern formed over the first insulating layer in the peripheral region, the dummy pattern including a first doped polysilicon layer, a second insulating layer and a second doped polysilicon layer, the first doped polysilicon being contacted with the channel region of the driving transistor through the second contact hole;

a third contact hole formed in the semiconductor layer and the first insulating layer in the peripheral region;

a conduction layer formed within the third contact hole to be contacted with the first doped polysilicon layer;

a third insulating layer formed over the plate node of the capacitor in the cell region and over the second doped polysilicon layer of the dummy pattern in the peripheral region; and a base substrate bonded on the third insulating layer.

2. The semiconductor memory device as claimed in claim 1, wherein the semiconductor layer in the cell region is thicker than the semiconductor layer in the peripheral region.

3. The semiconductor memory device as claimed in claim 1, the first isolation layers in the cell region are thicker than the second isolation layers in the peripheral region.

4. The semiconductor memory device as claimed in claim 1, wherein the base substrate is comprised of any one of silicon substrate, quartz substrate, glass substrate or sapphire substrate.

* * * * *